(12) United States Patent
Hwang

(10) Patent No.: US 8,580,678 B2
(45) Date of Patent: Nov. 12, 2013

(54) METHOD FOR FABRICATING SEMICONDUCTOR DEVICE WITH BURIED GATES

(75) Inventor: Sun-Hwan Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 124 days.

(21) Appl. No.: 13/242,709

(22) Filed: Sep. 23, 2011

(65) Prior Publication Data

US 2012/0108057 A1    May 3, 2012

(30) Foreign Application Priority Data

Oct. 28, 2010  (KR) .................. 10-2010-0106065

(51) Int. Cl.
*H01L 21/4763*  (2006.01)
*H01L 21/336*  (2006.01)

(52) U.S. Cl.
USPC ................ 438/636; 438/286; 438/586

(58) Field of Classification Search
USPC ........................ 438/286, 586, 636
See application file for complete search history.

(56) References Cited

U.S. PATENT DOCUMENTS

| | | | | |
|---|---|---|---|---|
| 7,423,318 | B2* | 9/2008 | Suh | 257/332 |
| 7,642,192 | B2* | 1/2010 | Hashimi et al. | 438/706 |
| 7,902,552 | B2* | 3/2011 | Sun | 257/68 |
| 2006/0205162 | A1* | 9/2006 | Suh | 438/286 |
| 2011/0070716 | A1* | 3/2011 | Kim | 438/386 |

FOREIGN PATENT DOCUMENTS

| | | |
|---|---|---|
| KR | 10-0517328 | 9/2005 |
| KR | 10-0604667 | 7/2006 |
| KR | 10-2008-0030385 | 4/2008 |
| KR | 1020110077966 | 7/2011 |

OTHER PUBLICATIONS

Notice of Allowance issued from Korean Intellectual Property Office on Nov. 30, 2011.

* cited by examiner

*Primary Examiner* — Luan C Thai
(74) *Attorney, Agent, or Firm* — IP & T Group LLP

(57) ABSTRACT

A method for fabricating a semiconductor device includes forming first plugs over a substrate, forming contact holes that expose the first plugs, ion-implanting an anti-diffusion material into the first plugs, and forming second plugs filling the contact holes.

14 Claims, 6 Drawing Sheets

METHOD FOR FABRICATING SEMICONDUCTOR DEVICE WITH BURIED GATES

CROSS-REFERENCE TO RELATED APPLICATIONS

The present application claims priority of Korean Patent Application No. 10-2010-0106065, filed on Oct. 28, 2010, which is incorporated herein by reference in its entirety.

BACKGROUND

1. Field

Exemplary embodiments of the present invention relate to a method for fabricating a semiconductor device, and more particularly, to a method for fabricating a semiconductor device with buried gates.

2. Description of the Related Art

As the open areas (e.g., exposed surfaces) of a bit line contact and a storage node contact decrease, it becomes difficult to form a landing plug in a process of forming a buried gate in a cell region when a Dynamic Random Access Memory (DRAM) device is fabricated.

To facilitate the formation of a landing plug, a method of forming a landing plug before a gate is formed in a peripheral region is suggested.

FIG. 1 is a cross-sectional view illustrating a structure of a conventional semiconductor device.

Referring to FIG. 1, a device isolation layer 12 is formed over a substrate 11, and trenches 13 are formed by simultaneously etching the substrate 11 and the device isolation layer 12. A gate insulation layer 14 is formed on the surface of the trenches 13, and buried gates 15 each of which fills a portion of each trench 13 are formed. Subsequently, landing plugs 16 isolated by the trenches 13 are formed over the substrate 11, and storage node contact plugs 17 are formed over the landing plugs 16. A sealing layer 18 and a gap-fill layer 19 are disposed over the buried gates 15 to fill the trenches 13. The storage node contact plugs 17 penetrate through an inter-layer dielectric layer 20 to be coupled with the landing plugs 16.

In FIG. 1, the landing plugs 16 and the storage node contact plugs 17 are formed of polysilicon, and the polysilicon is doped with a dopant, such as phosphorus (P), to increase contact resistance.

However, when the concentration of the dopant of the storage node contact plugs 17 is increased to increase a cell contact resistance, the amount of dopant diffused into the substrate 11 is increased. In this case, the refresh performance of the semiconductor device may be deteriorated due to an increase of an electric field in a cell junction.

Conversely, when the concentration of the dopant of the storage node contact plugs 17 is decreased, the semiconductor device may have high refresh performance because the amount of dopant diffused into the substrate 11 is decreased, but the cell contact resistance is decreased.

Thus, the cell contact resistance and refresh performance are in a trade-off relationship.

SUMMARY

An embodiment of the present invention is directed to a semiconductor device fabrication method that may enhance refresh performance as well as cell contact resistance.

In accordance with an embodiment of the present invention, a method for fabricating a semiconductor device includes: forming first plugs over a substrate; forming contact holes that expose the first plugs; ion-implanting an anti-diffusion material into the first plugs; and forming second plugs filling the contact holes.

In accordance with another embodiment of the present invention, a method for fabricating a semiconductor device includes: forming landing plugs over a substrate; forming trenches by etching the substrate using the landing plugs as etch barriers; forming buried gates each filling a portion of each trench; forming an inter-layer dielectric layer over the buried gates, wherein the inter-layer dielectric layer has contact holes to expose the landing plugs; ion-implanting an anti-diffusion material into the landing plugs; and forming storage node contact plugs filling the contact holes.

DETAILED DESCRIPTION

Figure 1:
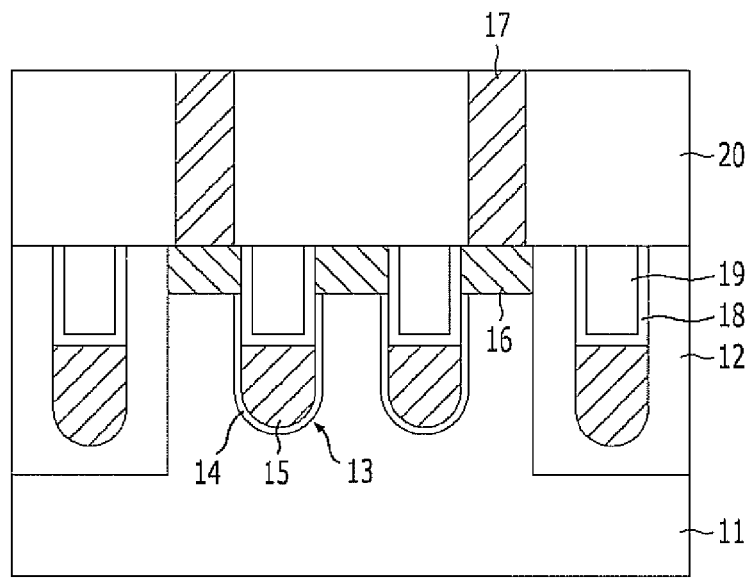
FIG. 1 is a cross-sectional view illustrating a structure of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2I are cross-sectional views illustrating a method for fabricating a semiconductor device in accordance with an embodiment of the present invention.

Figure 2A:
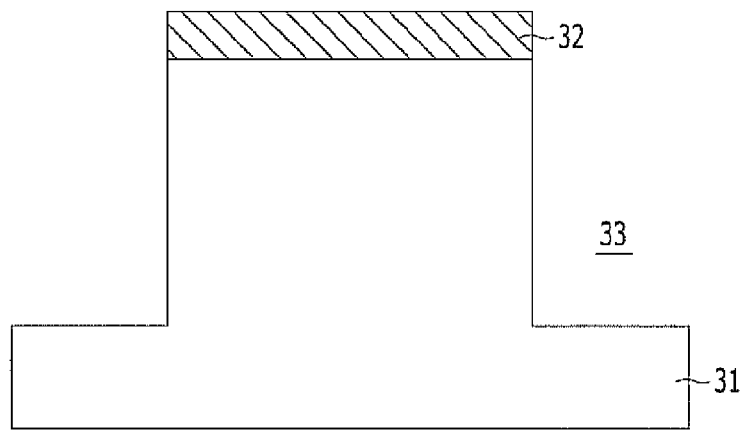
FIGS. 2A to 2I are cross-sectional views illustrating a method for fabricating a semiconductor device in accordance with an embodiment of the present invention.

Referring to FIG. 2A, a plug conductive layer 32 is formed over a substrate 31. Here, the plug conductive layer 32 includes a polysilicon layer and it is formed to have a thickness ranging from approximately 600 Å to approximately 1500 Å. The plug conductive layer 32 may also include a metal layer such as a tungsten layer.

Subsequently, a Shallow Trench Isolation (STI) process is performed. More specifically, first trenches 33 of a predetermined depth are formed by using a device isolation mask (not shown) and etching the plug conductive layer 32 and the substrate 31 of a device-isolation designated region. The plug conductive layer 32 functions as a hard mask during the STI process. Although not illustrated in the drawing, the STI process may be performed after a hard mask layer is formed of a nitride over the plug conductive layer 32.

Figure 2B:
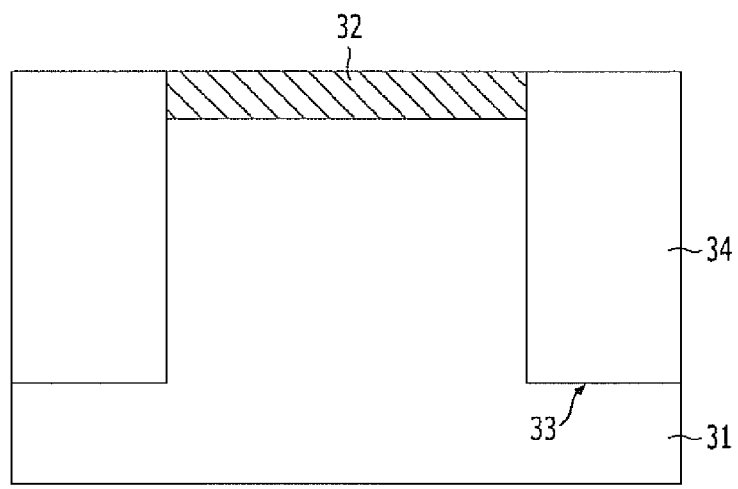

Referring to FIG. 2B, a device isolation layer 34 is formed by forming an insulation layer, such as a Spin-On Dielectric layer, to gap-fill the first trenches 33 and performing a planarization process, such as a Chemical Mechanical Polishing (CMP) process.

Figure 2C:
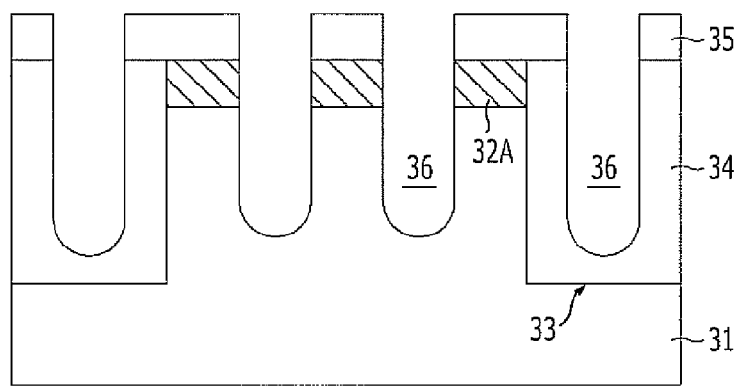

Referring to FIG. 2C, mask and etch processes for forming buried gates are performed. More specifically, the plug conductive layer 32 and the substrate 31 of a gate designated region are etched using a photosensitive pattern 35. Thus, second trenches 36 of a predetermined depth are formed. The second trenches 36 may be formed by simultaneously etching the substrate 31 and the device isolation layer 34.

Landing plugs 32A are formed by using the photosensitive pattern 35 and etching the plug conductive layer 32, and the second trenches 36 are formed by etching the substrate 31 between the landing plugs 32A.

Figure 2D:
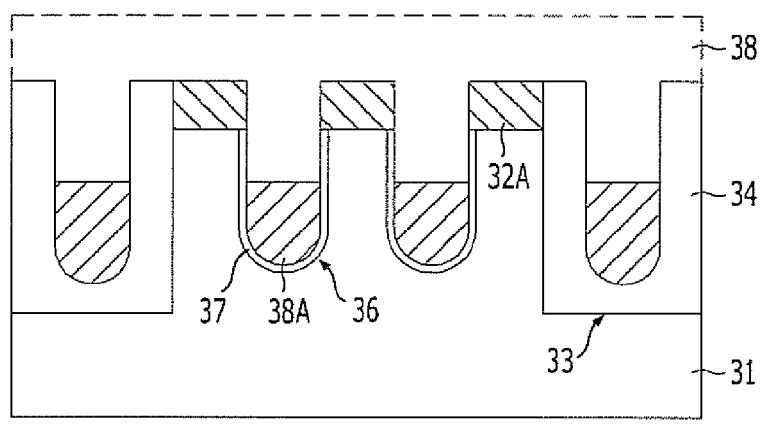

Referring to FIG. 2D, the photosensitive pattern 35 is removed. Subsequently, a gate insulation layer 37 is formed on the surface of the second trenches 36, and a gate conductive layer 38 is deposited over the gate insulation layer 37 to gap-fill the second trenches 36. The gate conductive layer 38 includes a titanium nitride (TiN) layer, a tantalum nitride (TaN) layer, and a tungsten (W) layer. For example, the gate conductive layer 38 may be formed by conformally depositing a thin titanium nitride (TiN) layer or a tantalum nitride (TaN) layer having a large work function and then gap-filling the second trenches 36 with a tungsten (W) layer for reducing resistance. Also, the gate conductive layer 38 may be formed by stacking a titanium nitride (TiN) layer and a tantalum nitride (TaN) layer, or sequentially stacking a titanium nitride (TiN) layer, a titanium nitride (TiN) layer, and a tungsten (W) layer. Here, the titanium nitride (TIN) layer may be formed to have a thickness of approximately 20 Å to approximately 80 Å.

Subsequently, buried gates 38A are formed by planarizing the gate conductive layer 38 through a CMP process and performing an etch-back process. The surface of the buried gates 38A may be lower than the surface of the substrate 31.

Figure 2E:
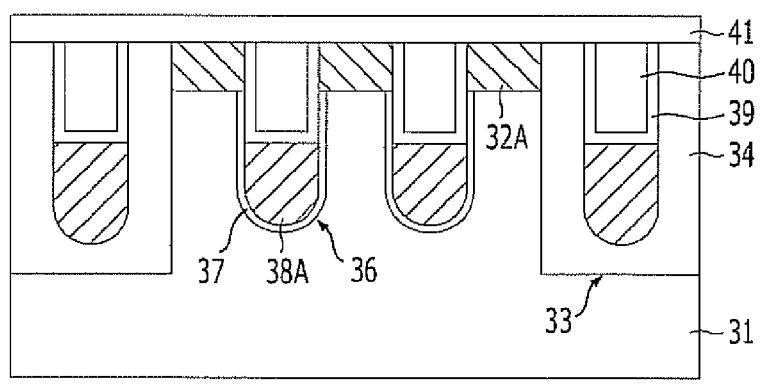

Referring to FIG. 2E, a first sealing layer 39 is formed to seal the upper portion of each buried gate 38A. Here, the first sealing layer 39 may be one selected from the group consisting of an oxide layer, a nitride layer, and a stacked layer of a nitride layer and an oxide layer. For example, the first sealing layer 39 may be a thinly sealed nitride layer.

A gap-fill layer 40 may be formed of a Spin-On Dielectric (SOD) material over the first sealing layer 39.

Subsequently, the first sealing layer 39 and the gap-fill layer 40 are planarized to expose the surface of the landing plugs 32A.

Subsequently, a second sealing layer 41 is formed over the substrate structure. The second sealing layer 41 may include a nitride layer.

Figure 2F:
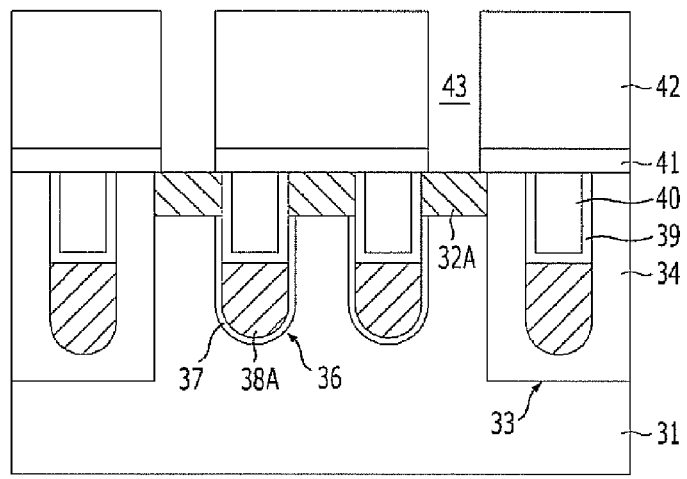

Referring to FIG. 2F, an inter-layer dielectric layer 42 is formed over the second sealing layer 41. The inter-layer dielectric layer 42 includes an oxide layer. For example, the inter-layer dielectric layer 42 includes a BPSG (boron-phosphorus-silicate-glass) layer.

Contact holes 43 exposing the surface of the landing plugs 32A are formed by etching the inter-layer dielectric layer 42 in use of a contact mask (not shown) and etching the second sealing layer 41. The contact holes 43 include storage node contact holes.

According to the embodiment of the present invention, the contact area between the landing plugs 32A and the substrate 31 may be secured wide by forming the plug conductive layer 32 and then forming the landing plugs 32A before the second trenches 36, where buried gates are to be formed, are formed. Consequently, contact resistance may be reduced.

Also, contact open error is prevented from occurring in the root or branch because the landing plugs 32A are formed not through a process of forming contact holes, depositing a plug conductive layer, and performing an etch process but through a process of depositing the plug conductive layer 32 and performing a trench etch process. As a result, bridge between neighboring landing plugs 32A may be prevented from occurring as well. Also, since an etch process for forming contact holes, where the landing plugs 32A are to be formed, is not to be performed, the substrate is protected from loss.

Figure 2G:
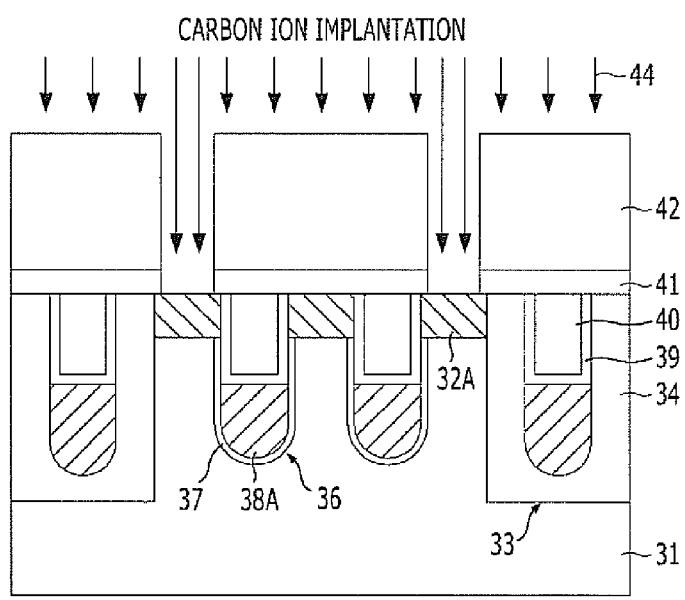

Referring to FIG. 2G, a first ion implantation process 44 is performed. The first ion implantation process 44 is a process of implanting ions of an anti-diffusion material. The anti-diffusion material includes carbon. The anti-diffusion material that is ion-implanted through the first ion implantation process 44 suppresses the dopant inside storage node contact plugs, which are to be formed subsequently, from thermally diffusing into the substrate. Meanwhile, the ion implantation may be performed to prevent the break-down features of the storage node contact plugs. This is referred to as an 'NM Implantation' process.

Through the first ion implantation process 44, carbon ions of a single carbon type (for example, carbon ions that are not clustered together and are implanted individually through ion implantation process) are implanted or carbon ions of a cluster carbon type (for example, carbon ions clustered together as a group) are implanted. The ion implantation energy ranges from approximately 1 KeV to approximately 500 KeV. The ion implantation dose ranges from approximately 1E12 atoms/cm$^3$ to approximately 1E17 atoms/cm$^3$.

A thermal treatment process is performed after the first ion implantation process 44. The thermal treatment process includes a rapid thermal process (RTP). The thermal treatment process may be omitted. The RTP may be performed at a temperature ranging from approximately 500° C. to approximately 1300° C. for approximately 0.1 to approximately 1000 seconds. Through the thermal treatment, the anti-diffusion material is distributed uniformly in each landing plug 32A. Although the thermal treatment is omitted, the anti-diffusion material dispersed on the surface of the landing plugs 32A exists to thereby suppress the dopant of the storage node contact plugs from diffusing into the substrate.

Figure 2H:
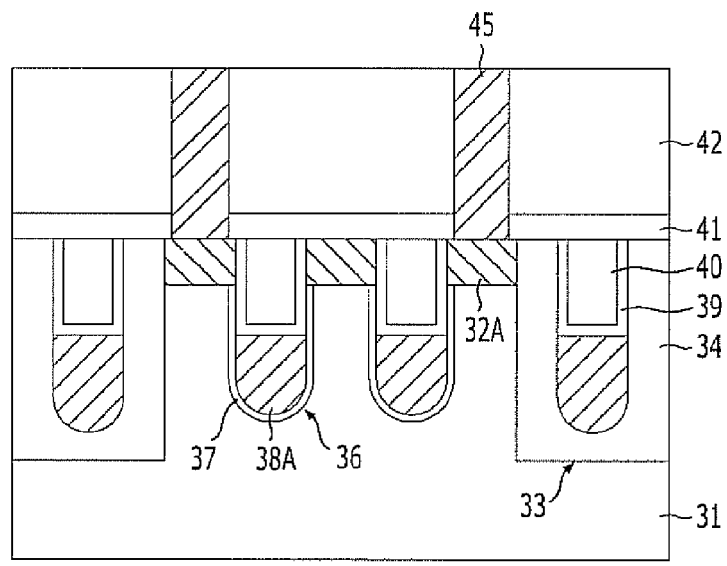

Referring to FIG. 2H, a polysilicon layer is formed over the substrate structure to fill the contact holes and then a planarization process is performed through such a process as a CMP process. As a result, storage node contact plugs 45 are formed. The polysilicon layer used as the storage node contact plugs 45 is doped with phosphorus (P). Here, the doping concentration of the phosphorus (P) ranges from approximately 1E19 atoms/cm$^3$ to approximately 1E22 atoms/cm$^3$. While the storage node contact plugs 45 are formed, the anti-diffusion material may be ion-implanted. For example, carbon, which is an anti-diffusion material, may be ion-implanted after a polysilicon layer that is to be used as the storage node contact plugs 45 is deposited.

Figure 2I:
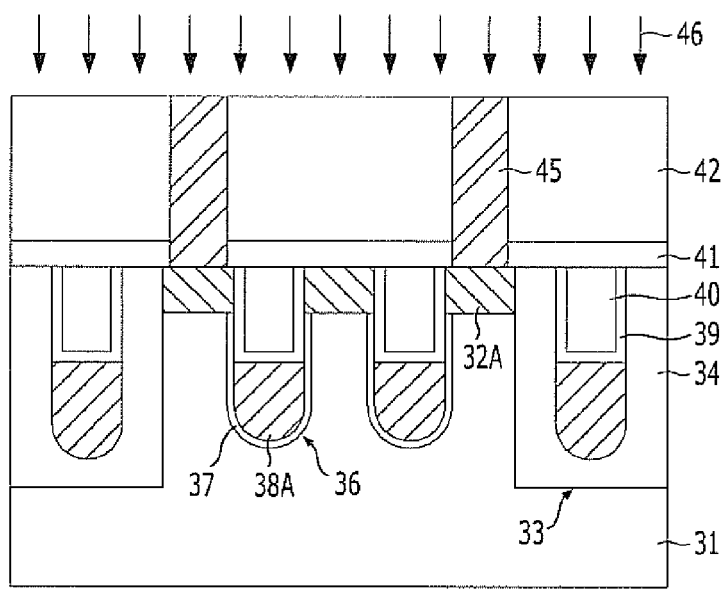

Referring to FIG. 2I, a second ion implantation process 46 is performed to enhance interface resistance. During the second ion implantation process 46, phosphorus (P) or arsenic (As) may be implanted or both phosphorus (P) and arsenic (As) may be implanted. Also, an anti-diffusion material may be ion-implanted after the second ion implantation process 46. For example, carbon, which is an anti-diffusion material, may be ion-implanted after the second ion implantation process 46. When the anti-diffusion material is ion-implanted, the diffusion of the dopant from the storage node contact plugs 45 into the landing plugs 32A may be suppressed. After all, the amount of the dopant diffusing into the substrate 31 may be remarkably reduced.

Subsequently, a bit line formation process and a capacitor formation process are performed.

Figure 3:
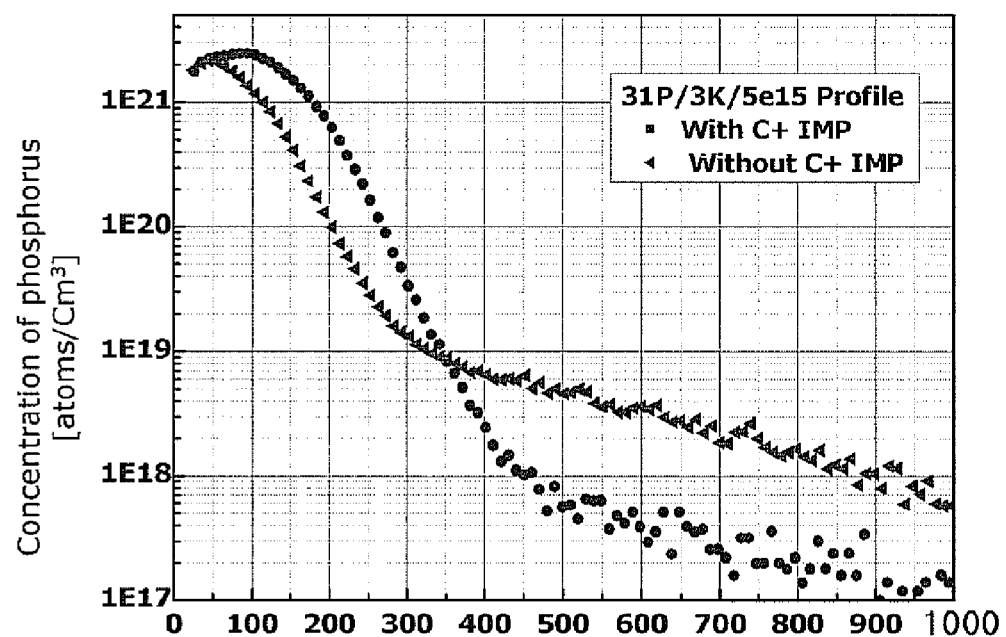
FIG. 3 is a graph illustrating suppression of a dopant diffusion in accordance with an embodiment of the present invention.

FIG. 3 is a graph illustrating suppression of a dopant diffusion in accordance with an embodiment of the present invention. The horizontal axis of the graph denotes the depth of the storage node contact plug or landing plug, while the vertical axis denotes the concentration of the dopant. Here, a case of using phosphorus (P) as a dopant is taken as an example.

It may be seen from FIG. 3 that the diffusion of phosphorus (P) is suppressed more in a case where a carbon ion implantation is performed (with C+ IMP) than in a case where a carbon ion implantation is not performed (without C+ IMP). Furthermore, phosphorus (P) exists more with C+ IMP than without C+ IMP at the same depth, which is approximately 350 Å or less, and this signifies that the diffusion of phosphorus (P) is suppressed more.

According to an embodiment of the present invention, the dopant in the storage node contact plugs may be prevented from diffusing into a substrate by ion-implanting an anti-diffusion material such as carbon before the storage node contact plugs are formed. Since the dopant is suppressed from diffusing into the substrate, the amount of dopant diffusing into the substrate is decreased and the amounts of dopant in the storage node contact plugs and landing plugs are increased. In this way, cell contact resistance and refresh performance may be enhanced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming first plugs over a substrate;
    forming contact holes that expose the first plugs;
    ion-implanting an anti-diffusion material into the first plugs, wherein the anti-diffusion material comprises carbon; and
    forming second plugs filling the contact holes.

2. The method of claim 1, wherein the carbon comprises clustered carbons.

3. The method of claim 1, wherein the second plugs are formed of polysilicon doped with a dopant.

4. The method of claim 1, wherein the first plugs and the second plugs are formed of polysilicon doped with a dopant.

5. The method of claim 1, further comprising:
    ion-implanting phosphorus or arsenic into the second plugs to control a contact resistance, after the forming of the second plugs.

6. The method of claim 1, wherein the second plugs comprise storage node contact plugs.

7. A method for fabricating a semiconductor device, comprising:
    forming landing plugs over a substrate;
    forming trenches by etching the substrate using the landing plugs as etch barriers;
    forming buried gates each filling a portion of each trench;
    forming an inter-layer dielectric layer over the buried gates, wherein the inter-layer dielectric layer has contact holes to expose the landing plugs;
    ion-implanting an anti-diffusion material into the landing plugs, wherein the anti-diffusion material comprises carbon; and
    forming storage node contact plugs filling the contact holes.

8. The method of claim 7, wherein the carbon comprises ion-implanting clustered carbons.

9. The method of claim 7, wherein the storage node contact plugs are formed of polysilicon doped with a dopant.

10. The method of claim 7, wherein the landing plugs and the storage node contact plugs are formed of polysilicon doped with a dopant.

11. The method of claim 7, wherein the forming of the storage node contact plugs comprises:
    depositing a polysilicon layer filling the contact holes;
    ion-implanting the anti-diffusion material into the polysilicon layer; and
    planarizing the polysilicon layer.

12. The method of claim 7, further comprising:
    ion-implanting the anti-diffusion material into the storage node contact plugs after the forming of the storage node contact plugs.

13. The method of claim 12, wherein a dopant for controlling contact resistance is ion-implanted into the storage node contact plugs, before the ion-implanting of the anti-diffusion material.

14. The method of claim 6, wherein the forming of the landing plugs comprises:
    forming a plug conductive layer over the substrate; and
    etching the plug conductive layer and the substrate to form a device isolation layer.

* * * * *